US012761246B2

(12) United States Patent
Nishiwaki et al.

(10) Patent No.: US 12,761,246 B2
(45) Date of Patent: *Oct. 13, 2026

(54) PROBE CARD FOR ELECTRICALLY CONNECTING TEST TARGET AND CIRCUIT TO GENERATE A TEST SIGNAL

(71) Applicant: NHK Spring Co., Ltd., Yokohama (JP)

(72) Inventors: Naruhiko Nishiwaki, Kanagawa (JP); Masahiro Takahashi, Kanagawa (JP); Kazuya Soma, Kanagawa (JP); Satoshi Shoji, Kanagawa (JP); Shuji Takahashi, Kanagawa (JP)

(73) Assignee: NHK Spring Co., Ltd., Yokohama (JP)

( * ) Notice: Subject to any disclaimer, the term of this patent is extended or adjusted under 35 U.S.C. 154(b) by 148 days.

This patent is subject to a terminal disclaimer.

(21) Appl. No.: 18/761,394

(22) Filed: Jul. 2, 2024

(65) Prior Publication Data

US 2024/0353445 A1 Oct. 24, 2024

Related U.S. Application Data

(63) Continuation of application No. 17/909,593, filed as application No. PCT/JP2021/007998 on Mar. 2, 2021, now Pat. No. 12,092,660.

(30) Foreign Application Priority Data

Mar. 11, 2020 (JP) ................................ 2020-042145

(51) Int. Cl.

*G01R 1/073* (2006.01)
*G01R 1/067* (2006.01)
*H10P 74/00* (2026.01)

(52) U.S. Cl.

CPC ..... *G01R 1/07342* (2013.01); *G01R 1/06705* (2013.01); *G01R 1/07314* (2013.01); *G01R 1/07364* (2013.01); *H10P 74/00* (2026.01)

(58) Field of Classification Search

CPC ........... G01R 1/07342; G01R 1/07314; G01R 1/06705; G01R 1/07364; H01L 22/00

(Continued)

(56) References Cited

U.S. PATENT DOCUMENTS

2004/0104738 A1 6/2004 Mori
2009/0167335 A1* 7/2009 Yamada ............ G01R 1/07378 324/762.05

(Continued)

FOREIGN PATENT DOCUMENTS

CN 101526553 A 9/2009
CN 107121573 A 9/2017

(Continued)

OTHER PUBLICATIONS

Office Action dated Mar. 25, 2022, issued for Taiwan Patent Application No. 110108148 and English translation thereof.

(Continued)

*Primary Examiner* — Raul J Rios Russo
(74) *Attorney, Agent, or Firm* — Troutman Pepper Locke LLP

(57) ABSTRACT

A probe card includes: a plurality of conductive contact probes; a probe head configured to accommodate ends of the plurality of contact probes; a laminated member laminated on the probe head on a side opposite to a side of the probe head; and a fastening member including a screw and a nut configured to fasten the probe head and the laminated member to each other, the screw including a head provided on the side of the probe head in which the contact probes extend outwardly, and a shaft inserted through the probe head and the laminated member, the shaft extending and having a diameter smaller than a diameter of the head. The shaft is fixed to the probe head, is threadedly connected to the nut on an end side opposite to the head side, and is (Continued)

configured to fasten the probe head and the laminated member to each other.

6 Claims, 4 Drawing Sheets

(58) Field of Classification Search
USPC ..................................................... 324/754.07
See application file for complete search history.

(56) References Cited

U.S. PATENT DOCUMENTS

| | | | | |
|---|---|---|---|---|
| 2009/0219042 | A1 | 9/2009 | Sasaki et al. | |
| 2010/0031504 | A1 | 2/2010 | Park et al. | |
| 2010/0139716 | A1 | 6/2010 | Richmond | |
| 2010/0164518 | A1* | 7/2010 | Yamada | G01R 1/07314 324/756.03 |
| 2010/0219852 | A1* | 9/2010 | Yamada | G01R 1/07371 324/756.03 |
| 2012/0007627 | A1 | 1/2012 | Chen et al. | |
| 2014/0210505 | A1 | 7/2014 | Chen et al. | |
| 2016/0047844 | A1 | 2/2016 | Wang et al. | |
| 2016/0305982 | A1 | 10/2016 | Hung | |
| 2021/0239735 | A1* | 8/2021 | Ahn | G01R 1/07371 |
| 2023/0107255 | A1* | 4/2023 | Nishiwaki | G01R 1/07314 324/754.07 |
| 2024/0393368 | A1* | 11/2024 | Yang | G01R 1/06755 |

FOREIGN PATENT DOCUMENTS

| | | | |
|---|---|---|---|
| CN | 208658226 | U | 3/2019 |
| JP | 2000-227443 | A | 8/2000 |
| JP | 2007-46372 | A | 2/2007 |
| JP | 2013-200266 | A | 10/2013 |
| JP | 5629545 | B2 | 11/2014 |
| JP | 2015-25749 | A | 2/2015 |
| JP | 2016-8948 | A | 1/2016 |
| KR | 10-2011-0087879 | A | 8/2011 |
| KR | 10 2018 137761 | A | 12/2018 |
| KR | 102037657 | B1 | 10/2019 |
| TW | 200848749 | A | 12/2008 |
| WO | 2010/117080 | A1 | 10/2010 |

OTHER PUBLICATIONS

Office Action dated Apr. 3, 2025, issued in the corresponding Chinese patent application No. 202180019402.4 and English translation thereof.
Korean Office Action dated Jul. 25, 2024, issued during the prosecution of Korean Patent Application No. 10-2022-7029899 and English translation thereof.

* cited by examiner

PROBE CARD FOR ELECTRICALLY CONNECTING TEST TARGET AND CIRCUIT TO GENERATE A TEST SIGNAL

FIELD

The present invention relates to a probe card.

BACKGROUND

In a semiconductor test process, conduction test is sometimes made at a wafer level before dicing to detect a defective product. In the conduction test at a wafer level, a probe card for accommodating a plurality of conductive contact probes is used in order to transmit a test signal, generated and output by a test device, to the wafer (see, for example, Patent Literatures 1 and 2).

A probe card includes a contact probe, a probe head that is made of a thin disk-shaped insulating material and accommodates and holds a plurality of contact probes in a predetermined pattern, a circuit board that is made of a disk-shaped insulating material and is provided with a wiring layer for electrical connection with a test device, a plurality of connectors that is arranged radially with respect to the center of the circuit board and connects the wiring on the circuit board to the outside, and a reinforcing member that is formed using a material having high rigidity and attached to one surface of the circuit board to reinforce the circuit board. The probe head and the reinforcing member are fastened by a screw.

CITATION LIST

Patent Literature

Patent Literature 1: JP 2013-200266 A
Patent Literature 2: Japanese Patent No. 5629545

SUMMARY

Technical Problem

Meanwhile, in the probe card described above, in a case where the screw protrudes from the probe head due to a loose screw, there is a possibility that the protruding screw interferes with the wafer to damage the wafer or that the screw falls off from the probe head.

The present invention has been made in view of the above, and an object thereof is to provide a probe card capable of preventing a screw from protruding from a probe head.

Solution to Problem

To solve the above-described problem and achieve the object, a probe card according to the present invention for electrically connecting a test target and a circuit configured to generate a test signal includes: a plurality of conductive contact probes; a probe head configured to accommodate ends of the plurality of contact probes so as to freely extend and retract with respect to an outside; a laminated member laminated on the probe head on a side opposite to a side of the probe head in which the contact probes extend outwardly; and a fastening member including a screw and a nut configured to fasten the probe head and the laminated member to each other, the screw including a head provided on the side of the probe head in which the contact probes extend outwardly, and a shaft inserted through the probe head and the laminated member, the shaft extending and having a diameter smaller than a diameter of the head, wherein the shaft is fixed to the probe head, is threadedly connected to the nut on an end side opposite to the head side, and is configured to fasten the probe head and the laminated member to each other.

Moreover, in the above-described probe card according to the present invention, the screw is threadedly connected to the probe head and is fixed to the probe head.

Moreover, in the above-described probe card according to the present invention, the probe head includes a main body, and a holding portion including an insertion hole through which the shaft is inserted and having rigidity higher than the main body.

Moreover, in the above-described probe card according to the present invention, the holding portion is detachable with respect to the probe head.

Moreover, the above-described probe card according to the present invention further includes a second nut provided on an opposite side to the head side of the screw in the probe head and is crimped on the probe head.

Moreover, in the above-described probe card according to the present invention, the probe head includes a hole configured to accommodate the head therein.

Moreover, in the above-described probe card according to the present invention, the laminated member includes a circuit board provided on an opposite side to the side of the probe head in which the contact probes extend outwardly, the circuit board including a wiring layer configured to be electrically connected to the test target, and a reinforcing member provided on an opposite side to the probe head side of the circuit board and configured to reinforce strength of the circuit board.

Advantageous Effects of Invention

According to the present invention, it is possible to prevent the screw from protruding from the probe head.

DESCRIPTION OF EMBODIMENTS

Hereinafter, embodiments of the present invention will be detailed with reference to the drawings. Note that the present invention is not limited to the following embodiments. In addition, each drawing referred to in the following description merely schematically illustrates a shape, a size, and a positional relationship to such an extent that the content of the present invention can be understood, and thus the present invention is not limited only to the shape, the size, and the positional relationship illustrated in each drawing.

Figure 1:
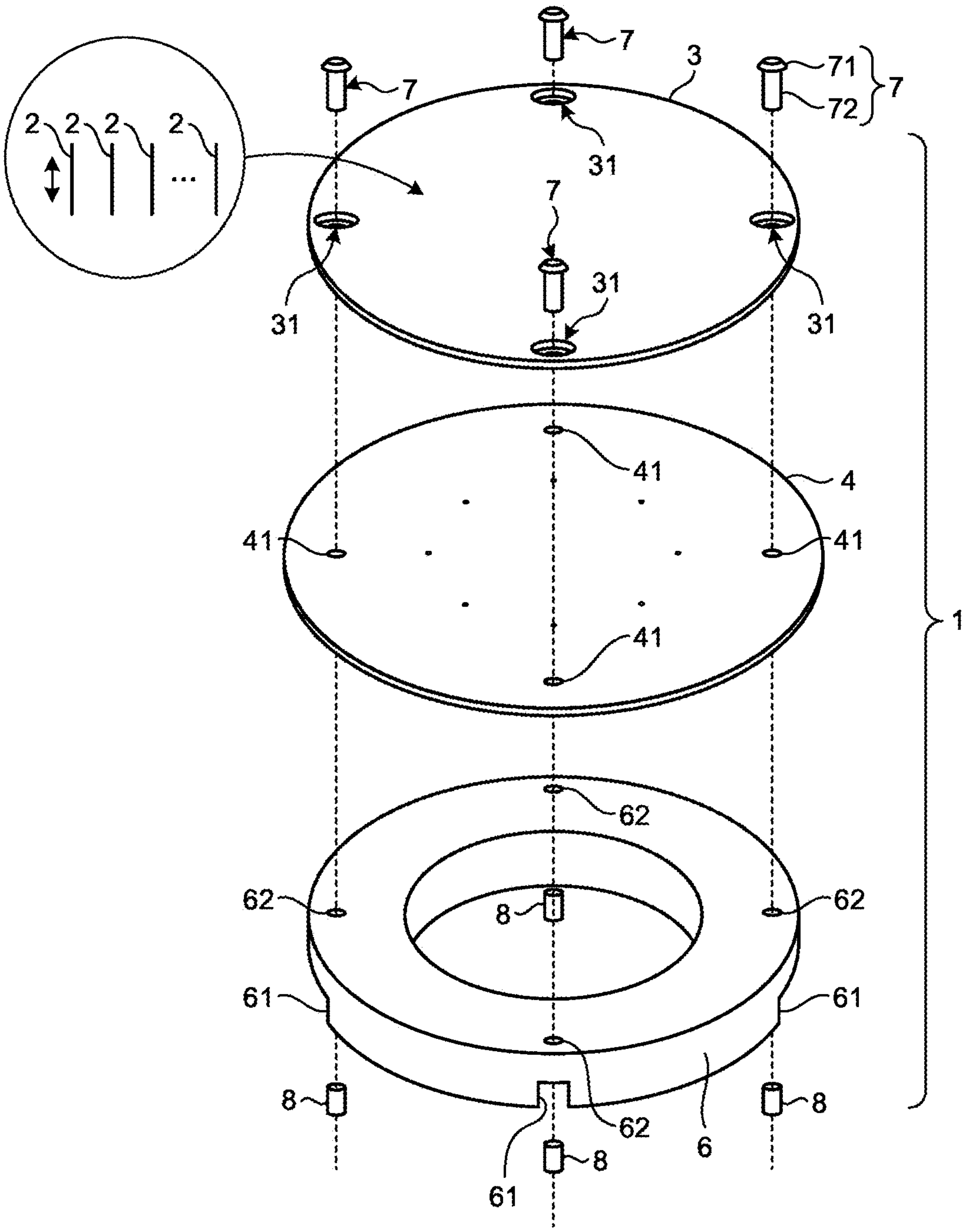
FIG. 1 is an exploded perspective view illustrating a configuration of a probe card according to an embodiment of the present invention.
Figure 2:
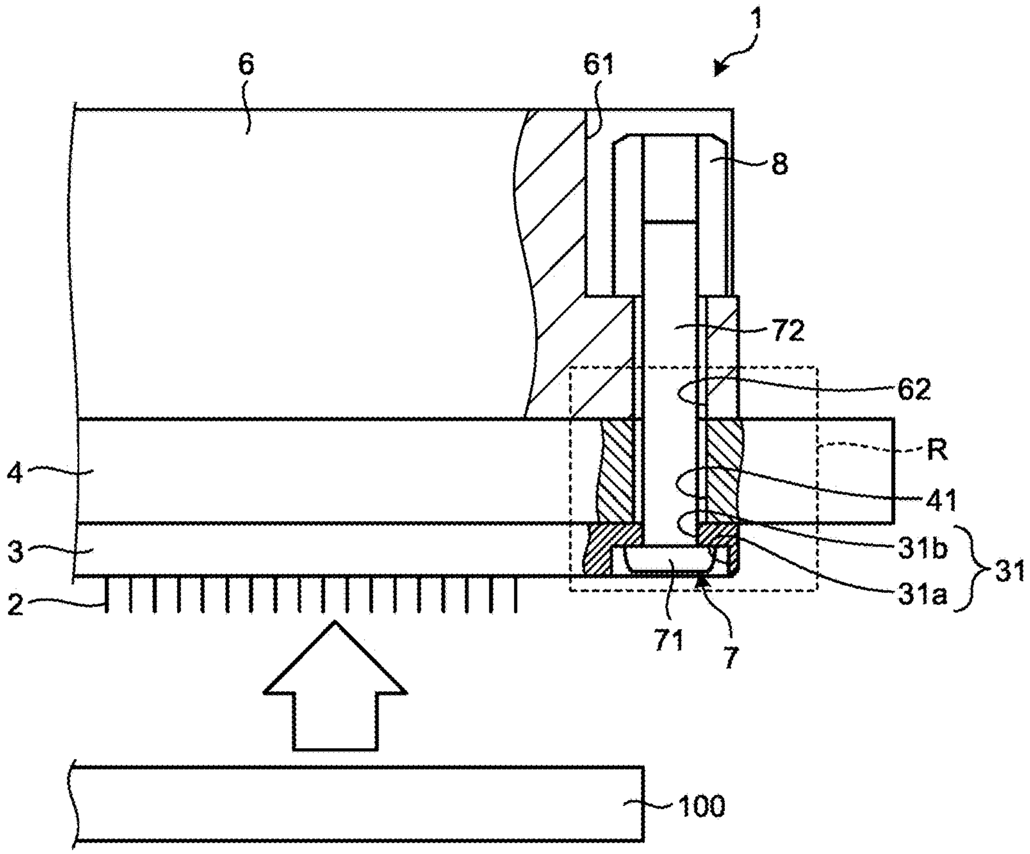
FIG. 2 is a partial cross-sectional view illustrating a configuration of a part of the probe card illustrated in FIG. 1.
Figure 3:
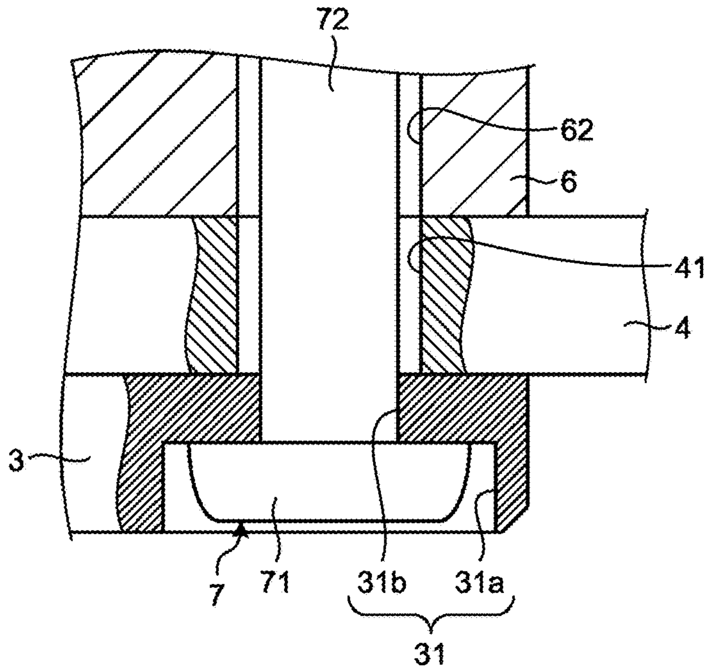
FIG. 3 is an enlarged view of a region R illustrated in FIG. 2.

FIG. 1 is an exploded perspective view illustrating a configuration of a probe card according to a first embodiment of the present invention. FIG. 2 is a partial cross-sectional view illustrating a configuration of a part of the probe card illustrated in FIG. 1. FIG. 3 is an enlarged view of a region R illustrated in FIG. 2. A probe card 1 illustrated in these drawings is a device that holds, in accordance with a predetermined pattern, a plurality of conductive contact probes that electrically connects a wafer 100 that is a test target and a test device having a circuit structure for generating a signal for test.

The probe card 1 includes a plurality of contact probes 2 (hereinafter, referred to as a "probe 2" simply), a probe head 3 that is made of an insulating material and accommodates and holds the plurality of probes 2 in a predetermined pattern, a circuit board 4 that is made of an insulating material and is provided with a wiring layer for electrical connection with the test device, a plurality of connectors (not illustrated) that connects the wiring on the circuit board 4 to the outside, a reinforcing member 6 that is formed using a material having high rigidity and attached to one surface of the circuit board 4 to reinforce the strength of the circuit board 4, and a screw 7 and a nut 8 that are provided between the probe head 3 and the reinforcing member 6 to fix the probe head 3 and the reinforcing member 6 to each other by fastening.

The probe 2 has an elongated shape and is formed to be extendable in the longitudinal direction. The probe 2 is formed using a conductive material. The probe 2 can adopt, for example, a configuration including a plunger and a coil spring, a configuration in which a pipe member is attached to a tip of a conductive member such as a pogo pin, a wire probe that bends a wire in a bow shape to obtain a load, or a connection terminal (connector) for connecting electrical contacts to each other, and these probes may be appropriately combined.

The probe head 3 has a disk shape, and the probe 2 is inserted through the probe head 3 and held therein. The probe head 3 holds the probe 2 so that an end on one end side of the probe 2 freely extends and retracts with respect to the outside in a state where the end on the end side of the probe 2 in contact with an electrode of the wafer 100 protrudes outwardly (see FIG. 2). For example, the probe head 3 is formed by laminating a disk-shaped first member through which one end side of the probe 2 is inserted and a disk-shaped second member through which the other end side of the probe 2 is inserted and which has the same diameter as that of the first member. Edge ends of the first member and the second member are fixed to each other by screwing or adhesion.

Further, the probe head 3 has an insertion hole 31 through which the screw 7 is inserted. The insertion hole 31 penetrates the probe head 3 between the surface on the circuit board 4 side and the opposite surface. The insertion hole 31 includes a first hole 31*a* formed on the surface opposite to the surface on the circuit board 4 side, and a second hole 31*b* that is formed on the surface on the circuit board 4 side and has a diameter smaller than that of the first hole 31*a*. The screw 7 is screwed into the second hole 31*b*, which allows the second hole 31*b* to function as a fixing portion for fixing the screw 7 to the probe head 3.

The probe head 3 is formed using an insulating material such as ceramics, e.g., alumina ($Al_2O_3$) and silicon nitride ($Si_3N_4$), or plastic resin. Note that the probe head 3 may be implemented by coating the surface of a conductive material such as metal with an insulating film.

The circuit board 4 is formed using an insulating material such as Bakelite or epoxy resin, and a wiring layer (wiring pattern) for electrically connecting the plurality of probes 2 and the test device to each other is three-dimensionally formed by a via or the like.

The circuit board 4 also has a hole 41 through which the screw 7 (shaft 72) is inserted. The hole 41 penetrates the circuit board 4 between the surface on the probe head 3 side and the opposite (reinforcing member 6 side) surface. The hole 41 has a diameter that is smaller than the diameter of the first hole 31*a* and is larger than the diameter of the second hole 31*b*, and the hole 41 extends in the plate thickness direction.

The reinforcing member 6 is crimped on the circuit board 4. The reinforcing member 6 reinforces, for example, the strength against warpage or distortion due to a load or heat from the outside of the circuit board 4. The reinforcing member 6 is made of a material having high rigidity such as aluminum that has been subjected to an anodic oxidation treatment, stainless steel, an invar material, a Kovar material (registered trademark), and duralumin.

Further, the reinforcing member 6 has a cutout portion 61 for accommodating the nut 8 and a hole 62 through which a part of the shaft 72 of the screw 7 is inserted. The hole 62 penetrates the reinforcing member 6 between the surface on the circuit board 4 side and the opposite surface. The diameter of the hole 62 is, for example, the same as the diameter of the hole 41.

In the present embodiment, the circuit board 4 and the reinforcing member 6 constitute a laminated member.

The screw 7 has a disk-shaped head 71 and a shaft 72 that has a diameter, in a direction orthogonal to the longitudinal axis, smaller than the diameter of the head 71 and extends in a rod shaped. The shaft 72 has an uneven portion for threadedly connecting to the nut 8 formed over the entire of the shaft 72 in the longitudinal axis direction. At a boundary between the head 71 and the shaft 72 of the screw 7, a step portion due to the difference in diameter is formed. Further, the head 71 is provided on the side of the probe head 3 on which the probe 2 extends outwardly, and the head 71 is accommodated in the first hole 31*a*.

Here, fastening by the screw 7 and the nut 8 is described with reference to FIGS. 2 and 3. The screw 7 is threadedly connected to the second hole 31*b* of the probe head 3 to be fixed to the probe head 3, and the screw 7 is threadedly connected to the nut 8 disposed in the cutout portion 61 to fasten the probe head 3, the circuit board 4, and the reinforcing member 6 to each other. At this time, the head 71 is crimped at a step portion formed by the first hole 31*a* and the second hole 31*b*. Further, the nut 8 is crimped at a step portion formed by the cutout portion 61 and the hole 62. The step portion herein has a surface intersecting the longitudinal axis of the screw 7 (shaft 72) in a state where the screw 7 is attached to the probe head 3 and so on. At this time, the surface is preferably orthogonal to the longitudinal axis of the screw 7.

In a state where the screw 7 is fixed to the probe head 3 (see FIG. 2), the head 71 is accommodated in the first hole 31*a*, and the screw 7 does not protrude from the surface of the probe head 3. Further, the nut 8 is accommodated in the cutout portion 61, and the nut 8 does not protrude from the surface of the reinforcing member 6. Further, the shaft 72 is not in contact with the hole 41 and the inner surface of the hole 62.

At this time, if the nut 8 is rotated with respect to the shaft 72 and loosened, the fastening force between the nut 8 and the head 71 may decrease; however, since the shaft 72 is threadedly connected and fixed to the second hole 31*b*, the screw 7 does not protrude from the surface of the probe head 3.

In the test using the probe card 1, an end on one end side of the probe 2 is in contact with an electrode of the wafer 100, and an end on the other end side of the probe 2 is in contact with an electrode of the circuit board 4. The both ends of the probe 2 come to contact with the wafer 100 and the circuit board 4, respectively, so that a test signal is input from the circuit board 4 to the wafer 100 via the probe 2.

Further, in the probe card 1, even in a case where the circuit board 4 is replaced with another circuit board, for example, a circuit board with a thin board, the replaced circuit board, the probe head 3, and the reinforcing member 6 can be fastened without changing the specifications of the screw 7 and the nut 8.

Figure 4:
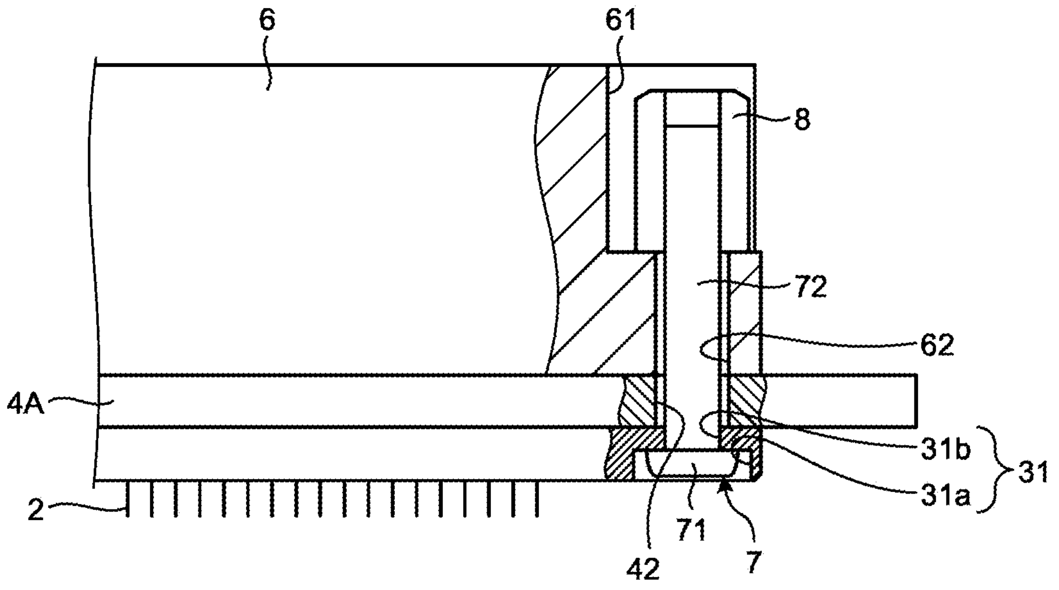
FIG. 4 is a partial cross-sectional view of the probe card illustrated in FIG. 1, and is an explanatory diagram of a configuration for a case where a circuit board having another thickness is disposed.

FIG. 4 is a partial cross-sectional view of the probe card illustrated in FIG. 1, and is an explanatory diagram of a configuration for a case where a circuit board having another thickness is disposed. A circuit board 4A illustrated in FIG. 4 has a thickness smaller than that of the circuit board 4. The circuit board 4A has a hole 42 through which the screw 7 (shaft 72) is inserted. As with the hole 41, the hole 42 penetrates the circuit board 4A between the surface on the probe head 3 side and the opposite (reinforcing member 6 side) surface. The hole 42 has a diameter that is smaller than the diameter of the first hole 31*a* and is larger than the diameter of the second hole 31*b*, and the hole 42 extends in the plate thickness direction.

In a state where the screw 7 is fixed to the probe head 3 (see FIG. 4), the head 71 is accommodated in the first hole 31*a*, and the screw 7 does not protrude from the surface of the probe head 3. Specifically, in a case where the circuit board 4A is used instead of the circuit board 4, the head 71 does not protrude from the surface of the probe head 3 although how long the shaft 72 comes in with respect to the nut 8 varies. Further, the nut 8 is accommodated in the cutout portion 61, and the nut 8 does not protrude from the surface of the reinforcing member 6. Further, the shaft 72 is not in contact with the hole 42 and the inner surface of a second hole 62.

According to the embodiment described above, in the screw 7 and the nut 8 that fasten the probe head 3, the circuit board 4 (or 4A), and the reinforcing member 6, the head 71 of the screw 7 is disposed on the probe head 3 side and the nut 8 is disposed on the reinforcing member 6 side and fasten the probe head 3, the circuit board 4 (or 4A), and the reinforcing member 6, and the shaft 72 and the probe head 3 (second hole 31*b*) are fixed by screwing. According to the present embodiment, even in a case where the nut 8 is loosened, the state in which the probe head 3 and the screw 7 are fixed is maintained, which prevents the screw 7 from protruding from the probe head 3.

In addition, according to the embodiment, since the screw 7 is fixed to the probe head 3, for example, even if the nut 8 is removed from the shaft 72 for replacement of the circuit board, the screw 7 is not detached from the probe head 3, which facilitates replacement of the members laminated on the probe head 3.

Note that, in the embodiment, the fixing of the screw 7 to the hole may be reinforced, to the extent that the screws 7 can be replaced. For example, an adhesive having relatively low strength may be provided between the screw 7 and the hole to fix the screw 7 and the hole to each other.

First Modification

Figure 5:
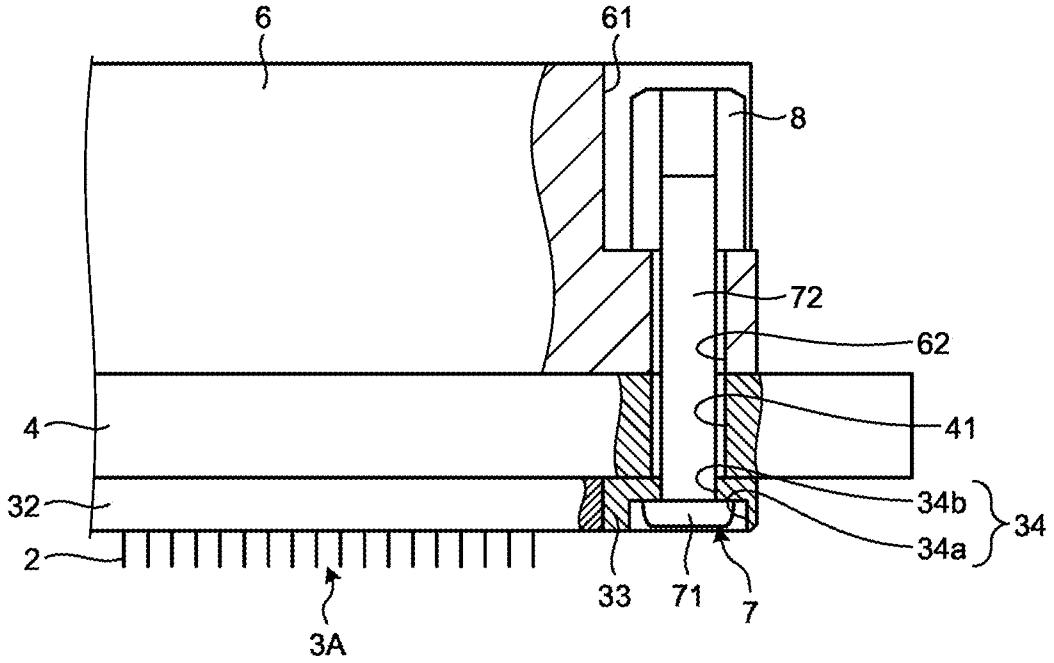
FIG. 5 is a partial cross-sectional view illustrating a configuration of a probe card according to a first modification to the embodiment of the present invention.

FIG. 5 is a partial cross-sectional view illustrating a configuration of a probe card according to the first modification to the embodiment of the present invention. The first modification is the same as the configuration of the embodiment described above except that the configuration of a probe head 3 is changed. The same configurations as those in the embodiment described above are denoted by the same reference numerals.

A probe head 3A according to the first modification includes a main body 32 holding a plurality of probes 2, and a holding portion 33 provided in an insertion portion of a screw 7. The configuration of the main body 32 is the same as the configuration of the probe head 3 except for a formation region of the holding portion 33.

The holding portion 33 has rigidity higher than that of the main body 32. Further, the holding portion 33 has an insertion hole 34 through which the screw 7 is inserted. The insertion hole 34 penetrates the holding portion 33 between the surface on the circuit board 4 side and the opposite surface. The insertion hole 34 includes a first hole 34*a* formed on the surface opposite to the surface on the circuit board 4 side, and a second hole 34*b* that is formed on the surface on the circuit board 4 side and has a diameter smaller than that of the first hole 34*a*. The screw 7 is screwed into the second hole 34*b*, which allows the second hole 34*b* to function as a fixing portion for fixing the screw 7 to the probe head 3A. The holding portion 33 is made of, for example, a metal material. Incidentally, the thickness of the holding portion 33 is the same as the thickness of the main body 32.

According to the first modification described above, the effect of the embodiment described above can be achieved, and fixing of the screw 7 to the probe head 3A can be made more secure by making the rigidity of the holding portion 33 higher than the rigidity of the main body 32.

Second Modification

Figure 6:
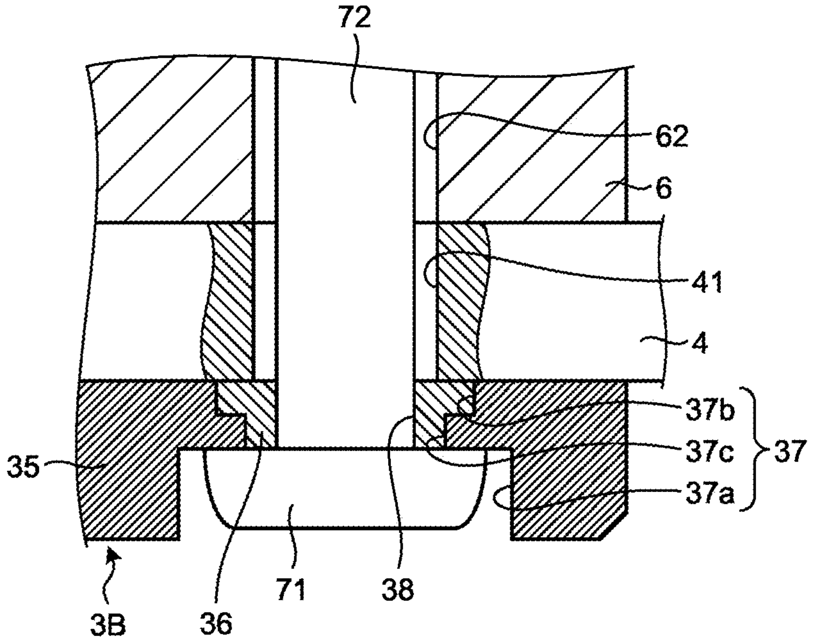
FIG. 6 is a partial cross-sectional view illustrating a configuration of a probe card according to a second modification to the embodiment of the present invention.

FIG. 6 is a partial cross-sectional view illustrating a configuration of a probe card according to the second modification to the embodiment of the present invention. The second modification is the same as the configuration of the embodiment described above except that the configuration of a probe head 3 is changed. The same configurations as those in the embodiment described above are denoted by the same reference numerals.

A probe head 3B according to the second modification includes a main body 35 holding a plurality of probes 2, and a holding portion 36 provided in an insertion portion of a screw 7. The configuration of the main body 35 is the same as the configuration of the probe head 3 except for a formation region of the holding portion 36. Incidentally, the main body 35 has a holding hole 37 for holding the holding portion 36. The holding hole 37 penetrates the main body 35 between the surface on the circuit board 4 side and the opposite surface. The holding hole 37 includes a first hole 37*a* that is formed on the main body 35 on a side opposite to the circuit board 4 side and has an opening larger than the head 71, a second hole 37*b* formed on the main body 35 on the circuit board 4 side, and a third hole 37*c* that is formed on the main body 35 between the first hole 37*a* and the second hole 37*b* and has a diameter smaller than that of the second hole 37*b*. In the second modification, the configuration in which the diameter of the second hole 37*b* is smaller than the diameter of the first hole 37*a* is described as an example; however, the diameter of the second hole 37*b* may be equal to or larger than the diameter of the first hole 37*a*.

The holding portion 36 has rigidity higher than that of the main body 35. The holding portion 36 has a cylindrical shape with an outer periphery having a step shape, and the shape of the outer periphery corresponds to the shape of the inner surface of the holding hole 37. The holding portion 36 is detachably provided with respect to the holding hole 37. Note that, if it is unnecessary to detach the holding portion 36, the holding portion 36 may be pressed into the holding hole 37 or fixed to the main body 35 by screwing or adhesion.

Further, the holding portion 36 has an insertion hole 38 through which the screw 7 is inserted. The insertion hole 38 penetrates the holding portion 36 between the surface on the circuit board 4 side and the opposite surface. The insertion hole 38 has a diameter smaller than that of a hole 41. The screw 7 is screwed into at least a part of the insertion hole 38, which allows the insertion hole 38 to function as a fixing portion for fixing the screw 7 to the probe head 3B. The holding portion 36 is made of, for example, a metal material. Incidentally, the thickness of the holding portion 36 is the same as the thickness of a holding section of the holding portion 36 in the main body 35.

According to the second modification described above, the effect of the embodiment described above can be achieved, and only the holding portion 36 can be replaced in the probe head 3B. The shape of the inner surface of the holding hole 37 is set such that the holding hole 37 on the circuit board 4 side has a diameter larger than that of the holding hole 37 on the opposite side, and the holding portion 36 is retained at a step portion formed by the second hole 37*b* and the third hole 37*c* of the holding hole 37, which prevents the holding portion 36 from being detached from the probe head 3B in a state where the probe card is assembled.

Third Modification

Figure 7:
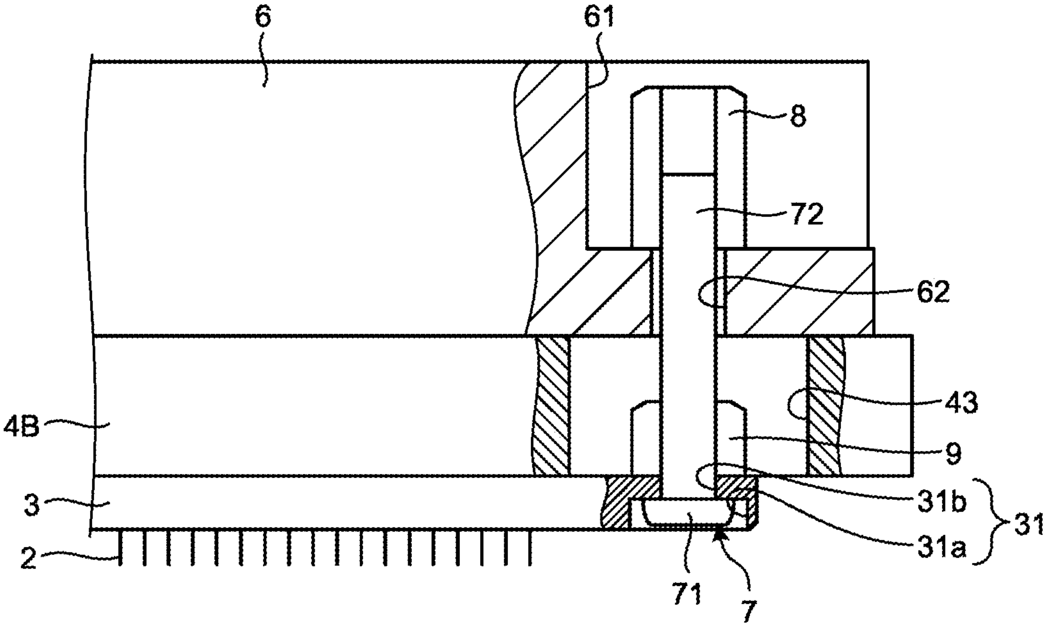
FIG. 7 is a partial cross-sectional view illustrating a configuration of a probe card according to a third modification to the embodiment of the present invention.

FIG. 7 is a partial cross-sectional view illustrating a configuration of a probe card according to the third modification to the embodiment of the present invention. The same configurations as those in the embodiment described above are denoted by the same reference numerals. The probe card according to the third modification includes a plurality of probes 2, a probe head 3, a circuit board 4B that is made of an insulating material and is provided with a wiring layer for electrical connection with a test device, a plurality of connectors (not illustrated) that connects the wiring on the circuit board 4B to the outside, a reinforcing member 6 that is formed using a material having high rigidity and attached to one surface of the circuit board 4B to reinforce the strength of the circuit board 4B, a screw 7 and a nut 8 (first nut) that are provided between the probe head 3 and the reinforcing member 6 to fix the probe head 3 and the reinforcing member 6 to each other by fastening, and a nut 9 (second nut) that is provided on the probe head 3 on the circuit board 4B side, namely, on a side opposite to the head 71 side of the screw 7 in the probe head 3 and is threadedly connected to the screw 7.

As with the circuit board 4, the circuit board 4B according to the third modification is formed using an insulating material such as Bakelite or epoxy resin, and a wiring layer for electrically connecting a plurality of contact probes 2 and the test device to each other is three-dimensionally formed by a via or the like.

The circuit board 4B also has a hole 43 through which the screw 7 (shaft 72) is inserted and in which the nut 9 is disposed. The hole 43 penetrates the circuit board 4B between the surface on the probe head 3 side and the opposite (reinforcing member 6 side) surface. The hole 43 has a diameter larger than the diameter formed by the outer periphery of the nut 9 and extends in the plate thickness direction.

The nut 9 is located inside the hole 43, and is threadedly connected to the shaft 72 and is crimped on the probe head 3.

According to the third modification described above, in the configuration of fastening the probe head 3, the circuit board 4B, and the reinforcing member 6, the head 71 of the screw 7 is disposed on the probe head 3 side and the nut 8 is disposed on the reinforcing member 6 side to fasten the probe head 3, the circuit board 4B, and the reinforcing member 6, the shaft 72 and the probe head 3 (second hole 31*b*) are fixed by screwing, and the nut 9 is provided on a side opposite to the head 71 side of the probe head 3 and crimped on the probe head 3. According to the third modification, even in a case where the nut 8 is loosened, the state in which the probe head 3 and the screw 7 are fixed is maintained, which prevents the screw 7 from protruding from the probe head 3. Further, in the third modification, the nut 9 is crimped on the probe head 3 to sandwich the probe head 3 between the head 71 and the nut 9, which prevents the protrusion of the screw 7 from the probe head 3 more reliably than in the embodiment described above.

In the embodiment and the modifications described above, the screw 7 is threadedly connected to the probe head 3 and fixed to the probe head 3; however, the present invention is not limited thereto, and the screw 7 may be fixed to the probe head 3 by press-fitting or adhesion.

Further, in the embodiment and the modifications described above, the present invention can be applied to a probe card having no reinforcing member 6. In this case, the nut 8 is crimped on the circuit board. In the circuit board, a hole shape having a step such as the cutout portion 61 and the hole 62 may be formed.

Further, in the embodiment and the modifications described above, the head 71 is accommodated in the hole (first hole) of the probe head; however, a cutout portion formed by cutting out a hole side surface may be provided instead of the first hole, or, alternatively, the head 71 may be exposed to the outer surface of the probe head and crimped on the outer surface without providing the first hole. In this case also, the shaft 72 is fixed to the probe head, which prevents the head 71 from moving from the fastening position to the outside of the probe head due to the loosened nut 8.

Further, in the embodiment and the modifications described above, the nut 8 is accommodated in the cutout portion of the reinforcing member 6; however, a hole having no cutout portion may be provided on the hole side surface instead of the cutout portion, or, alternatively, the nut 8 may be exposed to the outer surface of the reinforcing member and crimped on the outer surface without providing the cutout portion.

As described above, the present invention can include various embodiments and the like not described herein, and various design changes and the like can be made without departing from the technical idea specified by the claims.

INDUSTRIAL APPLICABILITY

As described above, the probe card according to the present invention is suitable for preventing the screw protruding from the probe head.

REFERENCE SIGNS LIST

1 PROBE CARD
2 CONTACT PROBE
3, 3A, 3B PROBE HEAD
4, 4A, 4B CIRCUIT BOARD
6 REINFORCING MEMBER
7 SCREW
8, 9 NUT
31, 34, 38 INSERTION HOLE
35 MAIN BODY
36 HOLDING PORTION
37 HOLDING HOLE
41, 42, 43, 62 HOLE
61 CUTOUT PORTION

The invention claimed is:

1. A probe card for electrically connecting a test target and a circuit configured to generate a test signal, the probe card comprising:

a plurality of conductive contact probes;

a probe head configured to accommodate ends of the plurality of conductive contact probes so as to freely extend and retract with respect to an outside;

a laminated member laminated on the probe head on a side opposite to a side of the probe head in which the conductive contact probes extend outwardly; and a fastening member including a screw and a nut configured to fasten the probe head and the laminated member to each other, the screw including a head provided on the side of the probe head in which the conductive contact probes extend outwardly, and a shaft inserted through the probe head and the laminated member, the shaft extending and having a diameter smaller than a diameter of the head, wherein the shaft is fixed to the probe head, is threadedly connected to the nut on an end side opposite to the head side, and is configured to fasten the probe head and the laminated member to each other, and the probe head includes a main body, and a holding portion provided inside the probe head, the holding portion including an insertion hole through which the shaft is inserted and having rigidity higher than the main body.

2. The probe card according to claim 1, wherein the screw is threadedly connected to the probe head and is fixed to the probe head.

3. The probe card according to claim 1, wherein the holding portion is detachable with respect to the probe head.

4. The probe card according to claim 1, further comprising a second nut provided on an opposite side to the head side of the screw in the probe head and is crimped on the probe head.

5. The probe card according to claim 1, wherein the probe head includes a hole configured to accommodate the head therein.

6. The probe card according to claim 1, wherein the laminated member includes a circuit board provided on an opposite side to the side of the probe head in which the conductive contact probes extend outwardly, the circuit board including a wiring layer configured to be electrically connected to the test target, and a reinforcing member provided on an opposite side to the probe head side of the circuit board and configured to reinforce strength of the circuit board.

* * * * *